United States Patent
Hamaguchi

[19]

[11] Patent Number: 6,118,703
[45] Date of Patent: Sep. 12, 2000

[54] NONVOLATILE STORAGE DEVICE AND CONTROL METHOD THEREFOR

[75] Inventor: Kumi Hamaguchi, Tokyo, Japan

[73] Assignee: NEC Corporation, Tokyo, Japan

[21] Appl. No.: 09/295,396

[22] Filed: Apr. 21, 1999

[30] Foreign Application Priority Data

Apr. 22, 1998 [JP] Japan .................................. 10-112279

[51] Int. Cl.⁷ .................................................. G11C 16/06
[52] U.S. Cl. .................. 365/185.22; 365/201; 371/21.2; 371/40.4; 371/49.1; 371/67.1
[58] Field of Search .............. 365/185.22, 201; 371/21.2, 40.4, 49.1, 67.1

[56] References Cited

U.S. PATENT DOCUMENTS

| | | |
|---|---|---|
| 4,811,294 | 3/1989 | Kobayashi et al. ...................... 365/189 |
| 5,263,031 | 11/1993 | Inoue ...................................... 371/40.1 |
| 5,974,579 | 10/1999 | Lepejian et al. ........................ 714/733 |

FOREIGN PATENT DOCUMENTS

| | | |
|---|---|---|
| 61-294565 | 12/1986 | Japan . |
| 3-286497 | 12/1991 | Japan . |
| 4-82090 | 3/1992 | Japan . |
| 6-120454 | 4/1994 | Japan . |

*Primary Examiner*—David Nelms
*Assistant Examiner*—Connie C. Yoha
*Attorney, Agent, or Firm*—Sughrue, Mion, Zinn, Macpeak & Seas, PLLC

[57] ABSTRACT

A nonvolatile storage device includes a first memory and a second memory in addition of a memory cell array. The first memory stores original data and the original data is copied onto the second memory. The original data stored in the first memory is compared with read data in bits to produce a comparison result for each bit. The copied original data stored in the second memory is reset in bits depending on the comparison result for each bit to produce write data to be written onto the addressed memory cells.

15 Claims, 5 Drawing Sheets under PRESENT INVENTION

NONVOLATILE STORAGE DEVICE AND CONTROL METHOD THEREFOR

BACKGROUND OF THE INVENTION

1. Field of the Invention

The present invention relates to an electrically programmable and erasable nonvolatile storage device and, more particularly, to techniques for verifying and correcting cell data stored in the nonvolatile storage device.

2. Description of the Related Art

An electrically programmable and erasable nonvolatile semiconductor storage device is called a flash memory which generally has a verifying function of cell data. In general, the verifying function includes the following functions: a first function of verifying whether program data has been correctly written in a memory and, if incorrect data exists, correcting the incorrect data; and a second function of verifying whether a memory has been erased normally in the case of erasing the memory cell and, if there is a memory cell which has not been erased, erasing this memory cell again. Both operations of these verifying functions are basically similar. The outline of the verifying function will be explained below.

FIG. 1 shows a verification circuit of a conventional non-volatile memory which has been described in Japanese Patent Application Laid-open Publication No. 3-286497, for example. Input program data is latched in a data latch circuit 11 and is then output to a data comparator 12 and a memory cell array 13 according to a designated address. The written data is read out by a sense amplifier (SA) 14 and is compared with the input program data by the data comparator 12. The comparison result is output as a verification result to a controller 15. The controller 15 resets the data latch circuit 11 depending on the verification result.

More specifically, the conventional non-volatile memory is provided with the data latch circuit 11 which is used to perform an erase-verification function or a write-verification function. In the case of the erase-verification function, all memory cells are subjected to the erase verification after the erasing operation has been completed. If at least one cell has not been completely erased, all memory cells are repeatedly subjected to the erase operation until all cells are normally erased.

In the case of the write-verification function, similar verification operations are performed as described in Japanese Patent Application Laid-open Publication No. 4-82090. More specifically, after writing data onto selected cells, data is read out from the selected cells and is then compared with latched data. If they do not match, the data is written onto the selected cells again.

As explained above, according to the conventional memory devices, a voltage supply circuit needs to supply a write/erase voltage to all the memory cells or all selected cells into which data are written at one time. Since all the memory cells or all the selected cells may include cells into which data has been normally written, the voltage supply circuit is burdened with a load larger than necessary.

Further, in the program operation, a higher voltage is applied to memory cells than at the time of reading. Therefore, an excessive writing operation, that is, a writing operation of data in a correctly written memory cell again, becomes a cause of generating a stress to the memory cell. Further, since the verifying operation in the case of the erasing of a memory cell is also carried out in the same circuit structure, this problem also applies to the erasing of memory cells. In the nonvolatile semiconductor storage device described in Japanese Patent Application Laid-open Publication No. 3-286497, a decision of whether a latch circuit is to be reset or not is made based on a result of a verification. However, as a resetting is carried out for the whole bits at one time, this nonvolatile semiconductor storage device also has a similar problem to the above.

SUMMARY OF THE INVENTION

It is an object of the present invention to provide a nonvolatile storage device and a control method therefor which are capable of reducing the load of a voltage supply circuit.

It is another object of the invention to provide a nonvolatile storage device and a control method therefor which are capable of not applying excess stress to memory cells by excessive writing or excessive erasing.

According to an aspect of the present invention, a nonvolatile storage device having an array composed of a plurality of nonvolatile memory cells therein includes a first memory for storing original data and a second memory connected to the first memory in series for storing write data to be written onto an addressed group of nonvolatile memory cells. The nonvolatile storage device further includes a comparator for comparing the original data with read data in bits to produce a comparison result for each bit, wherein the read data is read from the addressed group of nonvolatile memory cells, and a controller for copying the original data from the first memory to the second memory and resetting copied original data stored in the second memory in bits depending on the comparison result for each bit to produce the write data.

Since the copied original data stored in the second memory are reset in bits depending on the comparison result, only the bits which have not been reset are subjected to the write operation. Therefore, a burden on the voltage supply circuit is reduced and the memory cells are prevented from excess writing.

According to another aspect of the present invention, a method for controlling in a nonvolatile storage device including an array composed of a plurality of nonvolatile memory cells, is comprised of the steps of: a) storing original data onto a first memory, wherein the original data is to be written onto an addressed group of nonvolatile memory cells; b) copying the original data from the first memory to a second memory; c) comparing the original data with read data in bits to produce a comparison result for each bit, wherein the read data is read from the addressed group of nonvolatile memory cells; and d) resetting copied original data stored in the second memory in bits depending on the comparison result for each bit to produce write data in the second memory.

The method may further comprise the step of e) writing the write data stored in the second memory onto the addressed group of memory cells. The step b) is preferably performed before the step c) and further the steps b), c), d), and e) may be repeated until the comparison result indicates that the read data completely matches the original data.

DETAILED DESCRIPTION OF THE PREFERRED EMBODIMENT

Figure 2:
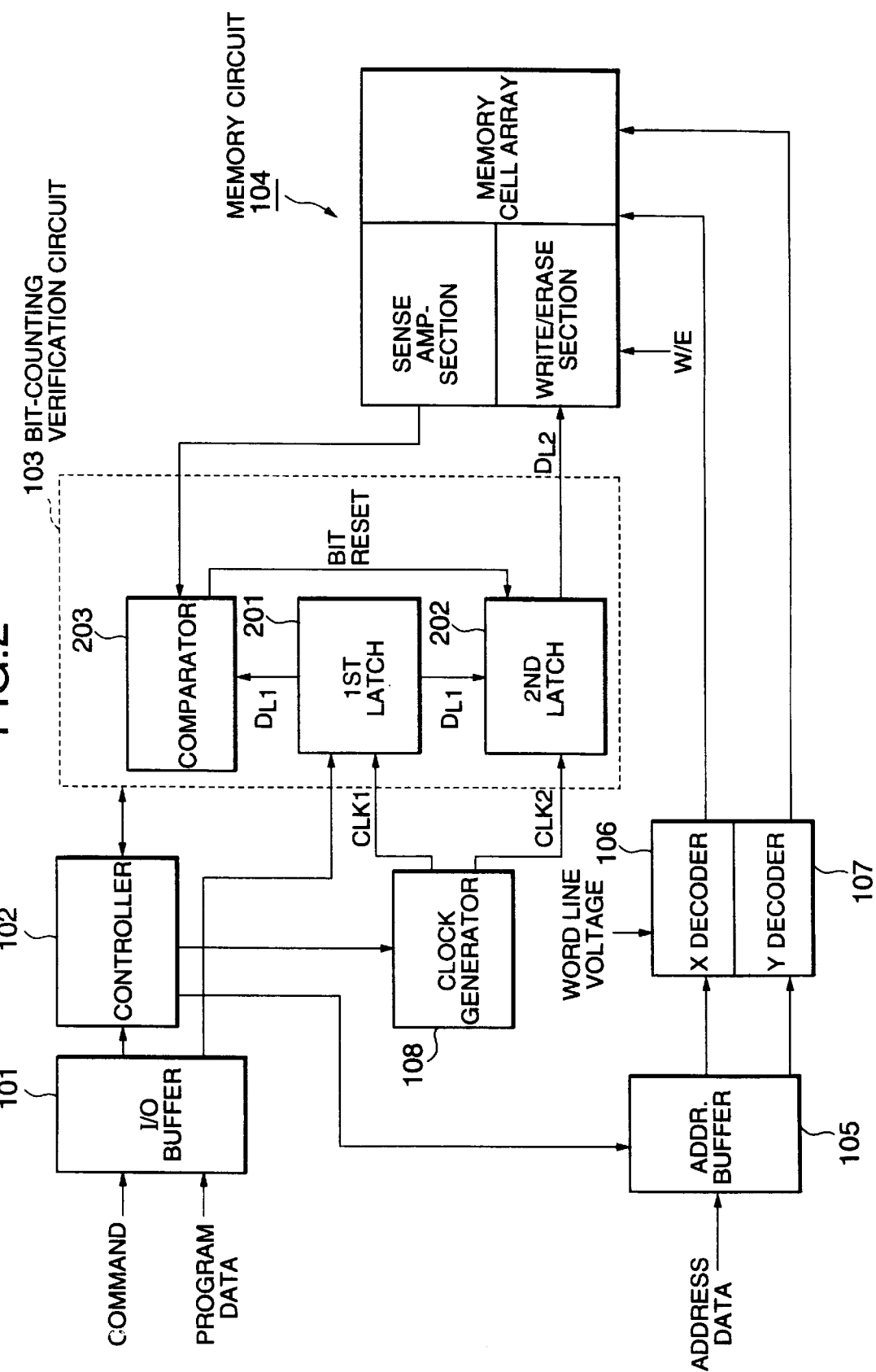
FIG. 2 is a block diagram showing an internal circuit of a semiconductor storage device according to an embodiment of the present invention.

Referring to FIG. 2, a semiconductor storage device includes an input/output buffer (hereinafter to be referred to as an I/O buffer) 101 which inputs a command and program data from outside. The command is output to a controller 102 and the program data is output to a bit-counting verification circuit 103.

The semiconductor storage device is provided with a memory circuit 104 composed of a memory cell array, a sense amplifier (SA) section, and a write/erase section. The memory cell array may be a flash memory, which can be erased and written, in fixed blocks. The sense amplifier section includes a plurality of sense amplifiers for reading out cell data from an addressed memory cell.

An address buffer 105 inputs address data from outside and outputs X and Y address data to X decoder 106 and Y decoder 107, respectively, under the control of the controller 102. Here, the X decoder 106 outputs a word line voltage to the gates of cells connected to a selected word line. As will be described later, the word line voltage is supplied by the voltage supply circuit (not shown) and changes among a low voltage level L, a high voltage level H (for example, 3–5 V) for reading, and a higher voltage level HV (for example, 10 V) for writing under the control of the controller 102. A memory cell is selected by the X and Y addresses and the selected memory cell is read or written.

A clock generator 108 generates a first clock signal CLK1 and a second clock signal CLK2 and outputs them to the bit-counting verification circuit 103. The bit-counting verification circuit 103 is composed of a first latch circuit 201, a second latch circuit 202 and a comparator 203. Under the control of the controller 102, the first and second clock signals CLK1 and CLK2 are supplied to the first and second latch circuits 201 and 202, respectively. The details of the bit-counting verification circuit 103 will be described hereinafter.

Figure 3:
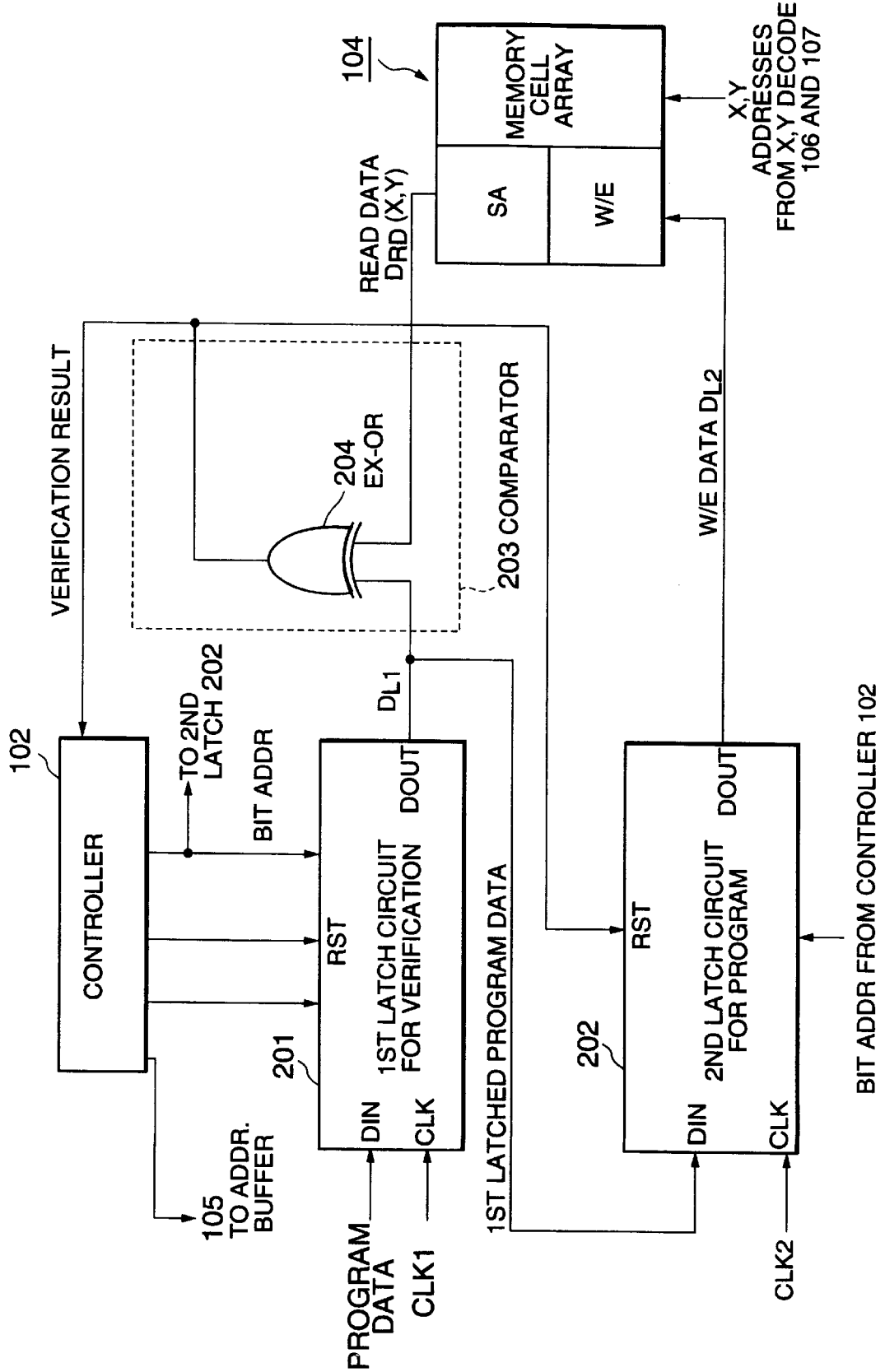
FIG. 3 is a block diagram showing a verification circuit according to the embodiment.

Referring to FIG. 3, the bit-counting verification circuit 103 is composed of the first latch circuit 201 for verification, the second latch circuit 202 for program, and the comparator 203 for verification. The comparator 203 is composed of an exclusive OR circuit 204. The first input terminal of the exclusive OR circuit 204 is connected to the output terminal of the first latch circuit 201 and the second input terminal thereof is connected to the sense amplifier section of the memory circuit 104.

The output terminal of the exclusive OR 204 is connected to the controller 102 and the reset terminal of the second latch circuit 202.

The input terminal of the first latch circuit 201 receives the program data from the I/O buffer 101 and the clock terminal receives the first clock signal CLK1 from the clock generator 108. The reset terminal of the first latch circuit 201 receives a rest signal from the controller 102. The output terminal is connected to the input terminal of the exclusive OR circuit 204 and the input terminal of the second latch circuit 202.

The clock terminal of the second latch circuit 202 receives the second clock signal CLK2 from the clock generator 108.

The reset terminal of the second latch circuit 202 receives a bit reset signal from the selector 206 of the comparator 203. The output terminal of the second latch circuit 202 is connected to the write/erase section of the memory circuit 104.

The exclusive OR circuit 204 inputs the latched program data $D_{L1}$ in bits from the first latch circuit 201 and the read data $D_{RD}$ in bits from the sense amplifier section of the memory circuit 104. The latched program data $D_{L1}$ is read in bits from the first latch circuit 201 according to a bit address signal received from the controller 102. The same bit address signal is output to the second latch circuit 202. The exclusive OR circuit 204 compares the latched program data $D_{L1}$ with the read data $D_{RD}$ in bits and output s a logical value (here, 1) when a match occurs at each bit and outputs the other logical value (here, 0) when no match occur at the bit. The comparator 203 may be a comparator which compares the first latched data $D_{L1}$ with the read data $D_{RD}(X,Y)$ in parallel.

The comparison result is output as a verification result to the controller 102 and the reset terminal of the second latch circuit 202. When receiving the reset signal from the exclusive OR circuit 204, the second latch circuit 202 resets the bit data corresponding to the bit address of the stored program data. As will be described later, the revised data including reset bits (PASS bits) and remaining bits (FAIL bits) are output as correction data to the write/erase section of the memory circuit 104 thereby only the memory cells corresponding to the FAIL bits are rewritten at the corresponding memory cells.

Figure 1:
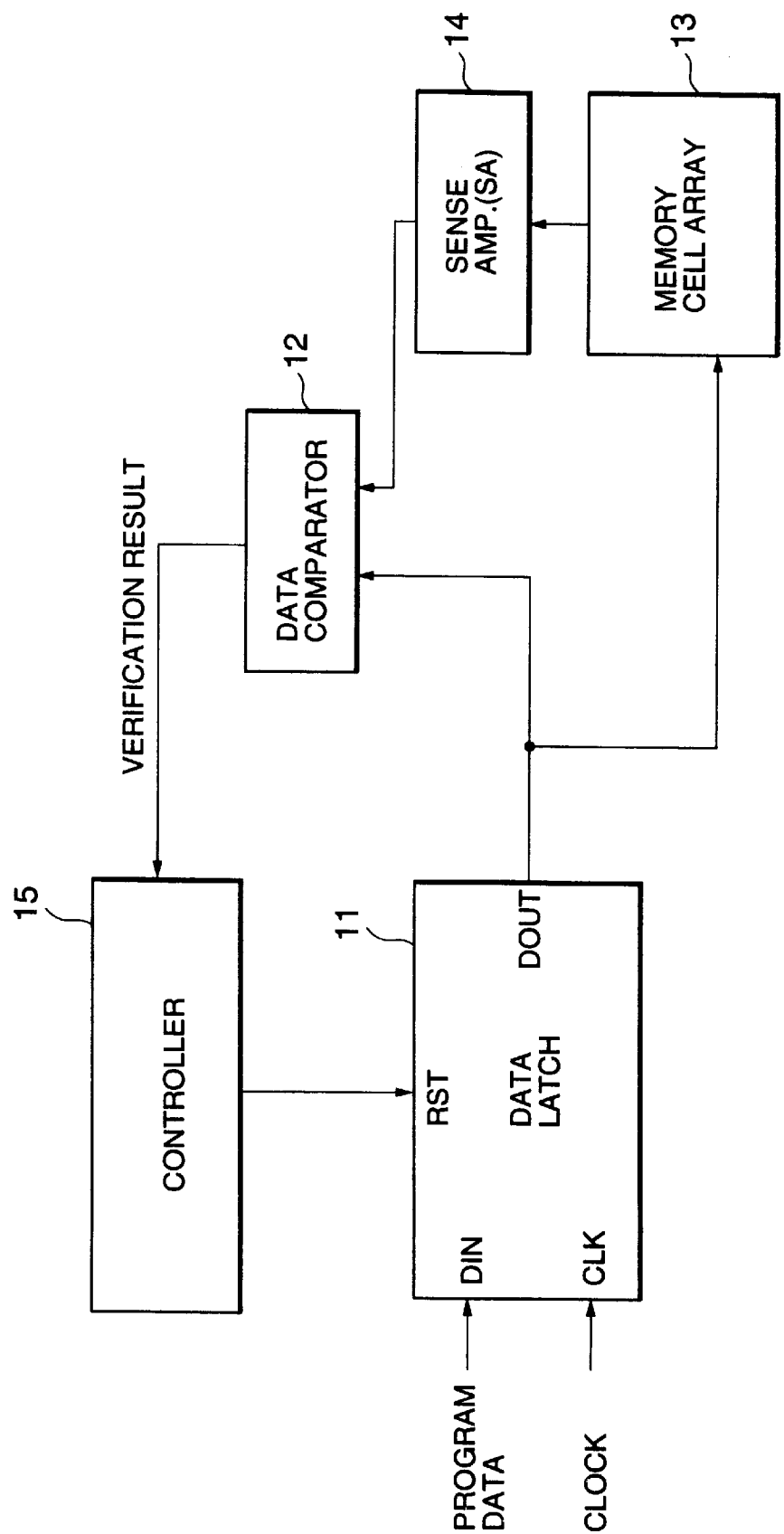
FIG. 1 is a block diagram showing a verification circuit of a conventional semiconductor storage device.

According to the present embodiment, as shown in FIG. 3, the two functions of the conventional latch circuit 11 (see FIG. 1) are separated, and each function is made to be held by independent latch circuits 201 and 202, respectively.

Next, the operation of the present embodiment will be explained. The operation of the present embodiment includes a write operation of program data and an erase operation which are selectively performed under the control of the controller 102. Here, the write operation will be described.

Figure 4:
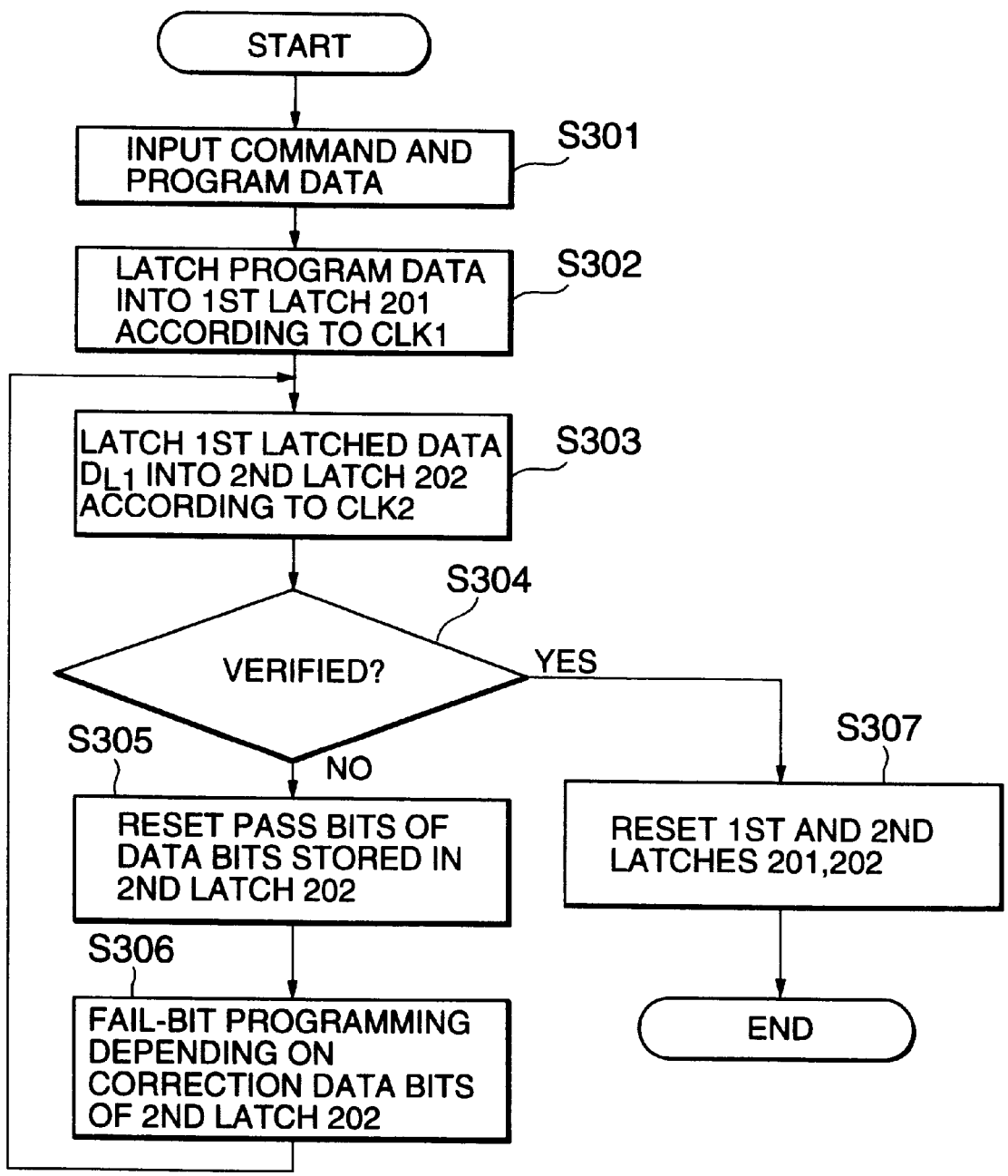
FIG. 4 is a flow chart showing a program verifying operation of the embodiment.

Referring to FIG. 4, when inputting an automatic program command and program data for writing from outside (step S301), the program data is latched in the first latch circuit 201 according to the timing of the first clock signal CLK1 (step S302). Thereafter, the first latched program data is copied from the first latch circuit 201 to the second latch circuit 202 according to the second clock signal CLK2 (step S303).

Thereafter, the verification operation is started by reading out word data in serial from the group of memory cells at the designated location in the memory cell array under the control of the controller 102. At the same time, the first latched data $D_{L1}$ is read out in bits according to the bit address signal received from the controller 102.

The read data $D_{RD}(X,Y)$ is compared bit by bit with the first latched data $D_{L1}$ by the comparator 203. More specifically, the exclusive OR circuit 204 produces the logical value of 0 when the data of a bit of the read data $D_{RD}(X,Y)$ is the same as the counterpart of the first latched data $D_{L1}$, otherwise produces the logical value of 1. The output of the exclusive OR circuit 204 is output as a verification result to the controller 102 and the second latch circuit 202. The controller 102 monitors the verification results for the read data to determine whether the read data $D_{RD}(X,Y)$ is verified (step S304). In the case where the read data $D_{RD}(X,Y)$ is not verified, the verification and correction steps S303–S306 are repeatedly performed until the read data $D_{RD}(X,Y)$ has been completely verified.

More specifically, if the data of a bit of the read data $D_{RD}(X,Y)$ is the same as the counterpart of the first latched data $D_{L1}$, the logical value of 0 is output from the exclusive OR circuit 204 to the controller 102 and the reset terminal of the second latch circuit 202. When receiving the logical value of 0 at the reset terminal, the second latch circuit 202 resets the current bit addressed by the bit address signal as a PASS bit (step S305).

On the other hand, if the data of a bit of the read data $D_{RD}(X,Y)$ is different from the counterpart of the first latched data $D_{L1}$, the logical value of 1 is output from the exclusive OR circuit 204 to the controller 102 and the reset terminal of the second latch circuit 202. When receiving the logical value of 1 at the reset terminal, the second latch circuit 202 leaves the current bit addressed by the bit address signal as it is, which will be recognized as a FAIL bit.

By performing the bit checking and correction operation as described above, the second latched data in the second latch circuit 202 is revised into correction data such that the PASS bits has been reset and the FAIL bits are left as they are. Therefore, the correction data in the second latch circuit 202 is output to the write/erase section of the memory circuit 104 and only the FAIL bits are programmed onto the corresponding memory cells at a location designated by the X and Y addresses in the memory cell array (step S306). In this way, the program data is written onto the memory cell array.

After the programming has been completed, the latched program data in the first latch circuit 201 is latched in the second latch circuit 202 according to the second clock signal CLK2 (step S303). And the steps S304–S306 are repeatedly performed until the read data $D_{RD}(X,Y)$ has been completely verified. When the read data $D_{RD}(X,Y)$ has been completely verified, the first and second latch circuits 201 and 202 are both reset (step S307).

Consider that the input program data is "1100". This program data "1100" indicates that no data is to be written in the highest-order and second-order bits ("11") and data is to be written in the third-order and fourth-order bits ("00"). As described above, this program data is being latched by the first latch circuit 201 and the second latch circuit 202.

On the other hand, when the read data $D_{RD}$ is "1101", this indicates that no data has been written in the highest-order and second-order bits ("11") and the fourth-order bit ("1") and that data has been written in the third-order bit ("0").

When this read data $D_{RD}$ is compared with the first latched program data $D_{L1}$, it is known that both the first latched data $D_{L1}$ and the read data $D_{RD}$ have "1" in the highest-order and the second-order bits, respectively. Therefore, a verification result for the bits in question becomes PASS. As these PASS bits are reset in the second latch circuit 202, the data of these bits become "1", respectively in the second latch circuit 202.

Similarly, as the first latched data $D_{L1}$ and the read data $D_{RD}$ have both "0" in the third bit, a verification result for that bit becomes PASS. As this bit is reset in the second latch circuit 202, the data of this bit becomes "1" in the second latch circuit 202.

On the other hand, as the first latched program data $D_{L1}$ has "0" and the read data $D_{RD}$ have "1" in the fourth bit respectively, a verification result for that bit becomes FAIL. Therefore, in the second latch circuit 202, the fourth bit is not reset, and the FAIL bit "0" is maintained as it is.

In other words, at the time of writing data based on a result of the verification operation, the data within the second latch circuit 202 changes from "1100" to "1110", and this changed data is given to the write/erase section of the memory circuit 104. Thus, data is written in only the memory cell corresponding to the FAIL bit.

In the above-described case, according to a conventional method, "1100" is given to the write/erase section, and data is also written in the third PASS bit. In contrast, the present embodiment makes it possible to prevent an excessive writing as explained above.

The details of write and verification operations will be described hereinafter with reference to FIG. 5.

The program data is a string of data bits consisting of 0s and 1s, and the bit-counting verification circuit 103 processes, for example, 8 bits or 16 bits in parallel in actual practice. However, the verification is carried out basically for each bit. Therefore, FIG. 5 shows the verifying operation for two cases of data bit "0" indicated by (c) to (h) and data bit "1" indicated by (i) to (n) as representative examples.

Figure 5:
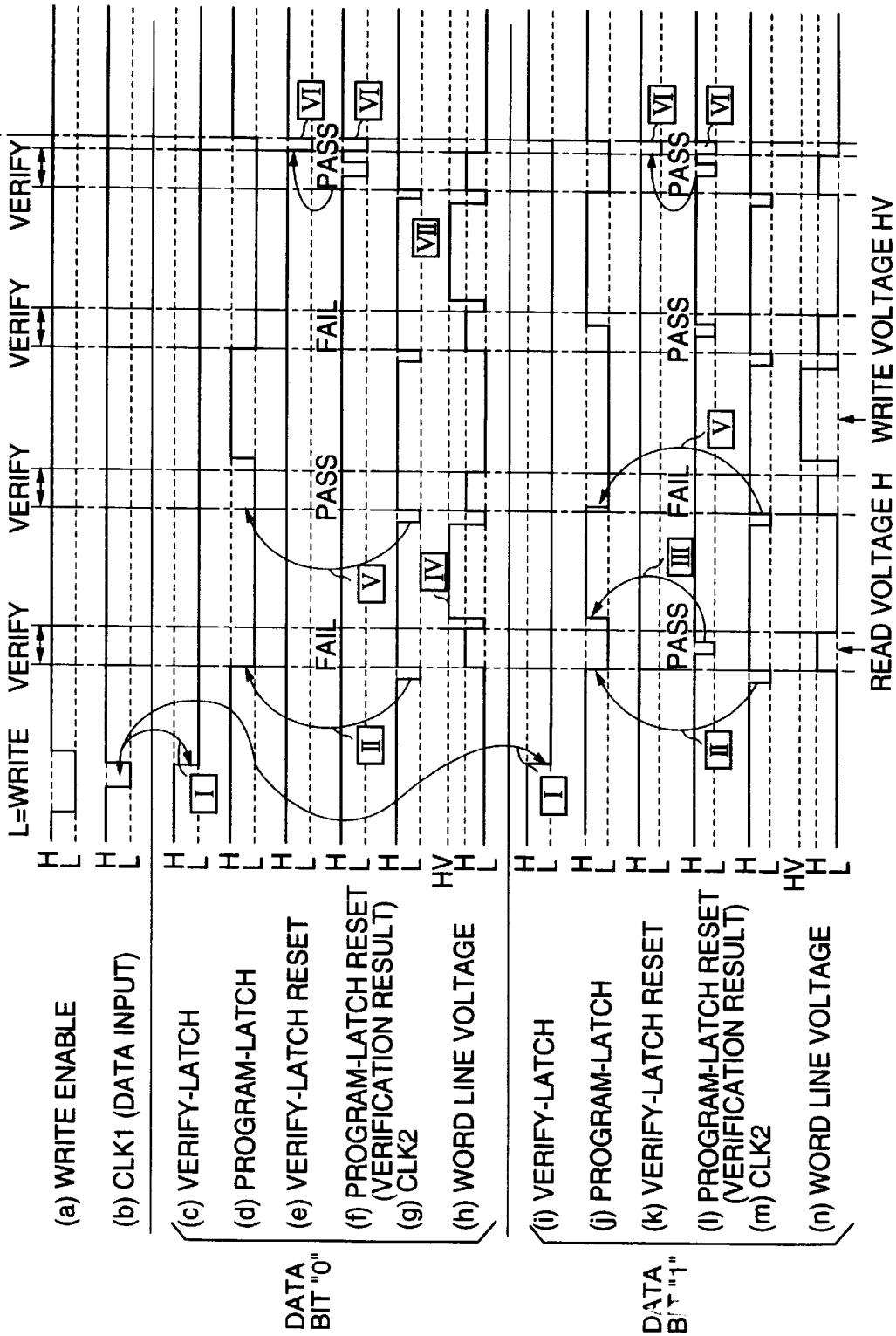
FIG. 5 is a time chart showing the program verifying operation of the embodiment.

Referring to FIG. 5, when inputting an automatic program command and program data for writing from outside, the controller 102 enables the first latch circuit 201 to latch the program data and instructs the clock generator 108 to generate the first clock signal CLK1 (see (a) and (b) of FIG. 5). The program data is latched in the first latch circuit 201 according to the timing of the first clock signal CLK1 as shown by a reference numeral (I).

Thereafter, the controller 102 instructs the clock generator 108 to generate the second clock signal CLK2. According to the second clock signal CLK2, the first latched program data in the first latch circuit 201 is further latched in the second latch circuit 202 as shown by a reference numeral (II).

After the first latched program data has been latched in the second latch circuit 202, the controller 102 instructs the voltage supply circuit (not shown) to apply a read voltage H to a designated word line of the memory cell array of the memory circuit 104 (see (h) and (n) of FIG. 5). This causes the memory circuit 104 to output the read data $D_{RD}(X,Y)$ to the comparator 203 of the bit-counting verification circuit 103 and the verification operation is started.

If a bit of the read data $D_{RD}(X,Y)$ matches the counterpart of the first latched data $D_{L1}$ as described before, the corresponding bit is reset as a PASS bit in the second latch circuit 202 as shown by a reference numeral (III). Contrarily, if a bit of the read data $D_{RD}(X,Y)$ does not match the counterpart of the first latched data $D_{L1}$, the corresponding bit is left as it is in the second latch circuit 202.

In this way, the second latched data in the second latch circuit 202 is revised such that the PASS bits has been reset and the FAIL bits are left as they are. Therefore, when no match occurs, the controller 102 controls the voltage supply circuit (not shown) so that the write voltage HV is applied to the designated word line and the revised latched data is output to the memory circuit 104 to program only the memory cells corresponding to the FAIL bits as shown by a reference numeral (IV).

Thereafter, according to the second clock signal CLK2, the first latched program data in the first latch circuit 201 is latched in the second latch circuit 202 as shown by a reference numeral (V).

After the first latched program data has been latched in the second latch circuit 202, the controller 102 instructs the voltage supply circuit to apply the read voltage H to the designated word line (see (h) and (n) of FIG. 5). This causes the memory circuit 104 to output the read data $D_{RD}(X,Y)$ to the comparator 203 of the bit-counting verification circuit 103 and the verification operation is repeated until all the read data match the first latched data as described above. When all the bits are PASS bits, the first and second latch circuits 201 and 202 are reset as shown by a reference numeral (VI).

With the above arrangement, in the case of a memory cell of the bit "0" which is a FAIL bit, a write HV (for example, 10 V) higher than a read voltage H (for example, 3 V to 5 V) is applied to the designated word line connected to the gates of the group of memory cells addressed by the X and Y addresses and the program data is written. On the other hand, in the case of a memory cell of the bit "1" which is a PASS bit, no voltage is applied to the word line gate, and the program data is not written in this memory cell.

In other words, in the program operation, after the reset operation for leaving the FAIL bit has been done to the data within the second latch circuit 202, the program operation is carried out to only the memory cell of the FAIL bit. This will be explained in detail by using values.

At first, in the flash memory, the data bit "0" shows a status that data has been written in the memory cell. On the other hand, the data bit "1" shows a status that data has been erased from the memory cell. Accordingly, the writing of data in the memory cell means to increase the voltage from a low level to a high level. Since the first verification operation is carried out before writing data in the memory cell, the cell data at this time (read data) shows a value before the writing, that is, an initial value. Accordingly, at the first verification operation, data is compared with the initial value.

In other words, in the first verification operation in the case where the read data (an initial value) is "0", a verification result becomes PASS when the program data is "0", and a verification result becomes FAIL when the program data is "1". Similarly, in the case where the read data (an initial value) is "1", a verification result becomes FAIL when the program data is "0", and a verification result becomes PASS when the program data is "1".

As explained above, the controller 102 repeatedly carries out the program operation and the program verification operation if there is at least one FAIL bit. When all the bits are PASS, the controller 102 outputs a reset signal to the first latch circuit 201 and the second latch circuit 202 is also reset.

There are cases where a memory cell which was once PASS becomes FAIL as a result of a decision of the next verification operation, as shown in FIG. 5. This occurs when a voltage of the memory cell is located near the verification decision level. In this case, if a bit once decided as PASS has been reset from the latch, the program operation (write) is not carried our for the memory cell even if this is a FAIL-bit memory cell.

In order to avoid this inconvenience, according to the present embodiment, the clock signal CLK2 is generated prior to each verification operation ((g) and (m) in FIG. 5), the program data of the second latch circuit 202 is returned to an initial status each time (II and V in FIG. 5), and a reset operations is carried out for only a PASS bit based on a result of verification operation again.

With the above arrangement, it becomes possible to write data in a memory cell which was once PASS in the first verification operation and was FAIL in the next verification operation (IV and VII in FIG. 4).

The erase operation of a memory cell will be explained next. The I/O buffer 101 is input from the outside an automatic program command for instructing an erase operation an program data for erasing. The program data for erasing is data for making the bit "1" to be written in all the memory cells.

Based on an erase instruction of the automatic program command input from the I/O buffer 101, the controller 102 at first makes the first latch circuit 201 and the second latch circuit 202 latch data for making the bit "0" to be written in all the memory cells. Therefore, the bit "0" is written onto all the memory cells. This is a measure for preventing an excessive erasing.

Next, the controller 102 carriers out an erase operation for making all the memory cells to be the bit "1". Thereafter, the controller 102 executes the verification operation in order to confirm whether this erase operation has been carried out correctly. This verification operation is similar to that of the write operation.

The controller 102 repeatedly carries out this verification operation by returning the latch data to the initial status by giving the clock signal CLK2 to the second latch circuit 202, until when all the memory cells become the bit "1" without leaving even one "0" bit memory cell which is not erased.

As explained above, according to the present invention, the write operation or the erase operation in memory cells is carried out by carrying out the processing to leave memory cells in which data is to be written or from which data is to be erased based on a verification result. Therefore, the number of cells to which a write/erase-voltage is applied can be reduced, resulting in reduced load with which the voltage supply circuit is burdened. As a result, it becomes possible to carry out easily the control of divided write operations in a low-voltage semiconductor storage device. Further, it also becomes possible to avoid applying useless stresses to the memory cells due to excessive writing or excessive erasing.

What is claimed is:

1. A nonvolatile storage device, comprising:
    an array composed of a plurality of nonvolatile memory cells;
    a first memory for storing original data;
    a second memory connected to the first memory in series, for storing write data to be written onto a addressed group of nonvolatile memory cells;
    a comparator for comparing an individual bit of original data with an individual bit of read data to produce a comparison result for each bit, wherein the read data is read from the addressed group of nonvolatile memory cells; and
    a controller for copying the original data from the first data memory to the second data memory and resetting an individual bit copied original data stored in the second memory depending on the comparison results of the bit of original data and the bit of read data to produce an individual bit of write data.

2. The nonvolatile storage device according to claim 1, wherein a bit of the copied original data is reset in a write operation when the comparison result indicates that data of a counterpart bit of the read data matches that of a counterpart bit of the original data.

3. The nonvolatile storage device according to claim 1, wherein a bit of the copied original data is reset in an erase operation when the comparison result indicates that data of a counterpart bit of the read data does not match that of a counterpart bit of the original data.

4. The nonvolatile storage device according to claim 1, wherein the controller writes the write data stored in the second memory onto the addressed group of memory cells.

5. The nonvolatile storage device according to claim 4, wherein the controller repeats copy, reset and write operations until the comparison result indicates that the read data completely matches the original data.

6. The nonvolatile storage device according to claim 5, wherein the controller resets the first and second memories when the comparison result indicates that the read data completely matches the original data.

7. A nonvolatile storage device; comprising:

an array composed of a plurality of nonvolatile memory cells;

a first latch for latching original data;

a second latch connected to the first latch in series, for latching write data to be written onto a addressed group of nonvolatile memory cells;

a controller controlling a bit address of each of the first and second latches so that the first latch outputs bit data corresponding to the bit address and the second latch; and a bit comparator for comparing an individual bit of the original data with an individual bit of read data to produce a verification result for each bit according to the bit address, wherein the read data is read from the addressed group of nonvolatile memory cells, and the second latch latches the original data from the first latch and resets an individual bit of latched original data depending on the verification result input from the bit comparator to produce an individual bit of write data.

8. The nonvolatile storage device according to claim 7, wherein the bit comparator comprises:

an exclusive OR circuit performing exclusive OR of the read data and the original data in bits.

9. The nonvolatile storage device according to claim 8, wherein a bit of the copied original data is reset in a write operation when the comparison result indicates that data of a counterpart bit of the read data matches that of a counterpart bit of the original data.

10. The nonvolatile storage device according to claim 8, wherein a bit of the copied original data is reset in an erase operation when the comparison result indicates that data of a counterpart bit of the read data does not match that of a counterpart bit of the original data.

11. A method for controlling in a nonvolatile storage device including an array composed of a plurality of nonvolatile memory cells, comprising the steps of:

a) storing original data onto a first memory, wherein the original data is to be written onto an addressed group of nonvolatile memory cells;

b) copying the original data from the first memory to a second memory;

c) comparing an individual bit of original data with a individual bit of read data to produce a comparison result for each bit, wherein the read data is read from the addressed group of nonvolatile memory cells; and d) resetting an individual bit of copied original data stored in the second memory depending on the comparison result for each bit to produce an individual bit of write data in the second memory.

12. The method according to claim 11, further comprising the step of:

e) writing the write data stored in the second memory onto the addressed group of memory cells.

13. The method according to claim 12, wherein the steps b), c), d), and e) are repeated until the comparison result indicates that the read data completely matches the original data.

14. The method according to claim 13, wherein the step b) is performed before the step c).

15. The method according to claim 13, further comprising the step of resetting the first and second memories when the comparison result indicates that the read data completely matches the original data.

* * * * *